(12) United States Patent
Kudo et al.

(10) Patent No.: US 6,879,153 B2
(45) Date of Patent: Apr. 12, 2005

(54) MAGNETIC SENSOR

(75) Inventors: Takahiro Kudo, Kanagawa (JP); Yujiro Kitaide, Tokyo (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 10/478,975

(22) PCT Filed: Jun. 4, 2002

(86) PCT No.: PCT/JP02/05464

§ 371 (c)(1),
(2), (4) Date: Jun. 1, 2004

(87) PCT Pub. No.: WO02/101396

PCT Pub. Date: Dec. 19, 2002

(65) Prior Publication Data

US 2004/0207398 A1 Oct. 21, 2004

(30) Foreign Application Priority Data

Jun. 6, 2001 (JP) .......................................... 2001-171078

(51) Int. Cl.$^7$ .............................................. G01R 33/00
(52) U.S. Cl. ....................................... 324/260; 324/244
(58) Field of Search ................................ 361/772–774, 361/760; 324/244, 249, 258, 260–261, 173–174; 257/687, 701–702; 174/52.2–52.4

(56) References Cited

FOREIGN PATENT DOCUMENTS

| DE | 195 18 157 | 11/1995 |
|---|---|---|
| EP | 0 892 276 | 1/1999 |
| EP | 0 930 508 | 7/1999 |
| EP | 1037056 A1 | 9/2000 |
| EP | 1 146 346 | 10/2001 |
| JP | 2000-081471 | 3/2000 |
| JP | 2000-193729 | 7/2000 |
| JP | 2000-258464 | 9/2000 |
| JP | 2001-116773 | 4/2001 |

*Primary Examiner*—Bot LeDynh
(74) *Attorney, Agent, or Firm*—Rabin & Berdo, P.C.

(57) ABSTRACT

To provide a magnetism detection apparatus that is small and low in cost and power consumption, a biasing coil 4 and a negative-feedback coil are integrated with a magnetic impedance element having a magnetic impedance effect in a resinous structure. The magnetism detection apparatus has a reduced magnetic resistance between the magnetic impedance element and the coil, thereby making it possible to apply a bias magnetic field and a negative-feedback magnetic field to the magnetic impedance element with a reduced power consumption.

18 Claims, 11 Drawing Sheets

IMPEDANCE OF
THE ELEMENT 1b

IMPEDANCE OF
THE ELEMENT 1a

OUTPUT STATUS AFTER
COMPLETION OF DIFFERENTIAL
AMPLIFICATION

IMPEDANCE OF
THE ELEMENT 1b

IMPEDANCE OF
THE ELEMENT 1a

OUTPUT STATUS AFTER
COMPLETION OF DIFFERENTIAL
AMPLIFICATION

MAGNETIC SENSOR

FIELD OF THE INVENTION

The present invention relates to a magnetism detection apparatus that utilizes a magnetic impedance effect, and more particularly to a magnetism detection apparatus having an improved constitution.

DESCRIPTION OF THE PRIOR ART

Conventionally, hall elements and magnetic-resistance elements have been used extensively in magnetic detection apparatuses. However, only a few of them can achieve a satisfactory level of magnetism detection sensitivity. Accordingly, a variety of proposals have been made concerning a highly sensitive magnetism detection element to replace the conventional magnetic-resistance element. The proposals include providing a magnetic impedance element based on the application of amorphous wires, as disclosed in Laid-Open Japanese Patent Publication No. HEISEI-6-281712 (1994), and providing a magnetic impedance element based on a thin-film application, as disclosed in the Laid-Open Japanese Patent Publication No. HEISEI-8-075835 (1996), for example.

Although any magnetic impedance element of any shape can exhibit its own characteristics for detection of magnetism with high sensitivity, since the magnetism-detecting characteristics of the element itself are non-linear (as in the case of the magnetic impedance characteristics of the amorphous wire shown in FIG. 14, as disclosed in the Laid-Open Japanese Patent Publication No. HEISEI-6-176930 (1994) and the Laid-Open Japanese Patent Publication No. HEISEI-6-347489 (1994) for example), a magnetism detection element having excellent linearity can be provided by improving the linearity of the dependency of the impedance variation on the applied magnetic field. This can be done by applying a bias magnetic field, or by feeding a current proportional to the voltage at both ends of a magnetic impedance element to a negative-feedback coil after winding the negative-feedback coil around the magnetic impedance element.

In a conventional method to conduct a bias magnet field to a coil wound on a magnetic impedance element, two types of coils, one for biasing and the other for feedback, must be wound on the magnetic impedance element, which increases the dimensions of the magnetic impedance element. As a result of the increased dimensions, the magnetic resistance of the magnetic impedance element and the magnetic resistance of the biasing coil and the feedback coil respectively increase, and thus the amount of current to be fed to these coils must be increased, making it difficult to reduce power consumption.

As a means to address this problem, by downsizing the magnetic impedance element to the maximum possible extent, it is possible to decrease the magnetic resistance between the magnetic impedance element and the coils. However, if amorphous wires are used, due to the difference in the tensile strength of the wires, that is, due to the difference in the magnetostrictive effect, the output level becomes variable.

In terms of the magnetostrictive effect, the lower the magnetism sensitivity (that is, the smaller the magnetic impedance element), the greater the magnetostrictive effect. This, in turn leads to various problems. For example, when downsized amorphous wires are employed, it is difficult to improve the precision in the detection of magnetism, and further, as the magnetostrictive effect varies depending on temperature and other factors, the durability against environmental conditions remains insufficient. FIG. 15 exemplifies a downsized magnetism detection apparatus using amorphous wires. The reference character W designates amorphous wires, whereas C designates a coil.

Further, even when a magnetic impedance element having a wired or a thin-film configuration is used, due to inconsistencies in the magnetic permeability and resistivity of the materials used in the manufacture of the magnetic impedance element, and also due to inconsistencies in the dimensions (length, film thickness, and film width) of the element, the magnetism sensitivity of the magnetic impedance element becomes variable.

FIG. 16 exemplifies a conventional magnetism detection circuit (magnetism sensor) of a conventional magnetic impedance element. In this example, the impedance value of the magnetic impedance element 1 is sought by causing an output current from a high-frequency current generator OSC to be fed to the magnetic impedance element 1, which is connected to a wave-detection circuit A. The wave detection circuit A is connected to an amplifying circuit B. During execution of this process, the output level is adjusted by a variable resistor VR.

Nevertheless, when the method shown in FIG. 16 is used, as the variable sensitivity of the magnetic impedance element 1 is adjusted simply by using a variable resistor VR, it is extremely difficult to minimize variations in sensitivity. Further, in order to minimize variations in the sensitivity of the magnetic impedance element 1 through the use of the above detection circuit, it is required that adjustment and calibration be performed for each detection circuit, thus sharply increasing costs. Although the detection circuit can be properly adjusted and calibrated, it is impracticable to calibrate the drifting effect of the output caused by degradation in the quality of the detection circuit over time.

SUMMARY OF THE INVENTION

Accordingly, the object of the present invention is to provide an improved high-precision and low-cost magnetism detection circuit without causing the detection precision to be reduced due to insufficient durability against environmental conditions or quality degradation of the magnetism detection circuit over time.

In order to solve the above problems, a magnetic detection apparatus in accordance with a first aspect of the invention is characterized by the provision of the following: a magnetic impedance element providing a magnetic impedance effect; terminals for applying AC current to both ends of the magnetic impedance element; a plurality of coils and terminals for applying a bias magnetic field to the magnetic impedance element; and a plurality of coils and terminals for applying a negative-feedback magnetic field to the magnetic impedance element; wherein the magnetic impedance element, those coils and terminals for applying the bias magnetic field to the magnetic impedance element, and those coils and terminals for applying the negative-feedback magnetic field to the magnetic impedance element, are integrally assembled through a resinous molding process.

A magnetic detection apparatus in accordance with the second aspect of the invention is characterized by the provision of the following: a pair of magnetic impedance elements individually providing a magnetic impedance effect; a plurality of terminals for applying AC current to both ends of a pair of said magnetic impedance elements; a plurality of coils and terminals for applying a bias magnetic field to a pair of said magnetic impedance elements; and a plurality of coils and terminals for applying a negative-feedback magnetic field to a pair of said magnetic impedance elements; wherein a pair of said magnetic impedance elements, a plurality of said coils and terminals for applying said bias magnetic field, and a plurality of said coils and terminals for applying said negative-feedback magnetic field, are integrally assembled through a resinous molding process.

With regard to the coil for applying said negative-feedback magnetic field to the magnetic impedance elements according to the second aspect of the invention, it is allowable to constitute this arrangement by employing a single coil, so as to provide a pair of said magnetic impedance elements with an identical directional magnetic field.

A magnetic detection apparatus in accordance with the third aspect of the invention is characterized by the provision of the following: at least two magnetic impedance elements individually providing a magnetic impedance effect; terminals for applying AC current to both ends of the at least two magnetic impedance elements; a magnet for applying a bias magnetic field to a plurality of said magnetic impedance elements; and a plurality of coils and terminals for applying a negative-feedback magnetic field to a plurality of said magnetic impedance elements; wherein a plurality of said magnetic impedance elements, said magnet, and a plurality of said coils and terminals for applying said negative-feedback magnetic field to a plurality of said magnetic impedance elements are integrally assembled through a resinous molding process.

With any of the first, second, or third aspects of the invention, it is allowable to integrally form a circuit that outputs a signal to the magnetic impedance elements in proportion to the output from these elements.

It is also allowable to apply a thin-film-type magnetic impedance element such as that described above.

BRIEF DESCRIPTION OF THE DRAWINGS

In the accompanying drawings.

DESCRIPTION OF THE PREFERRED EMBODIMENTS

Figure 1:
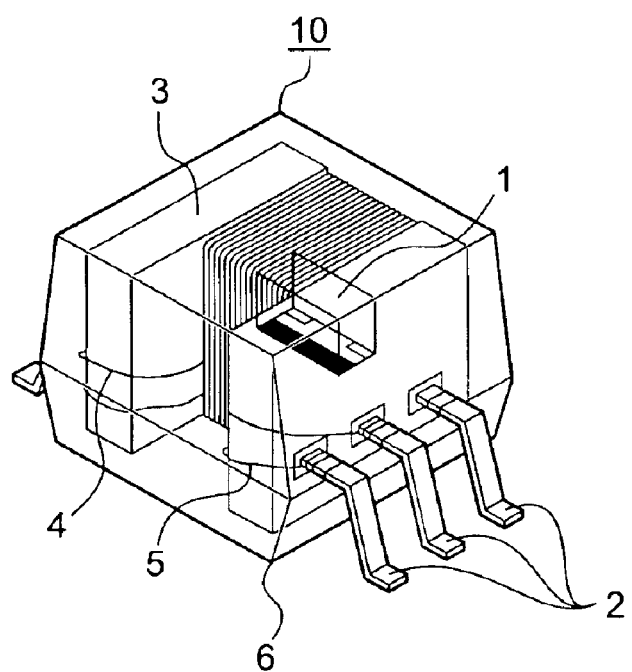
FIG. 1 is a perspective view of the first embodiment of a magnetism detection apparatus according to the present invention.

FIG. 1 is a perspective view of a magnetism detection apparatus according to a first embodiment of the present invention. Reference numeral 1 designates a magnetic impedance element having a thin-film configuration. Reference numeral 3 designates a resinous bobbin that is formed on the external side of the magnetic impedance element 1 by an insert-molding process. Reference numeral 4 designates a coil for applying a bias magnetic field to the magnetic impedance element 1. Reference numeral 5 designates a coil for applying a negative-feedback magnetic field to the magnetic impedance element 1. Reference numeral 6 designates a resinous case for protecting the magnetic impedance element 1 and the coils 4 and 5 from various environmental hazards, wherein the resinous case 6 is formed via an insert-molding process. Reference numeral 2 designates terminals for applying a high-frequency current to both ends of the magnetic impedance element 1 and also for applying current to the coils 4 and 5. Reference numeral 10 designates the magnetism detection apparatus comprising those components described above.

FIGS. 2(a) to 2(f) show the steps for sequentially assembling the above components into the magnetism detection apparatus related to the present invention.

Figure 2A:
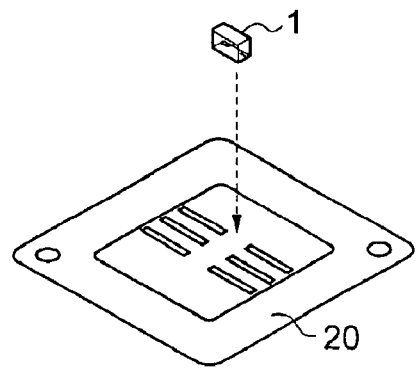
FIGS. 2(a)–2(f) are perspective views showing steps in the assembly of the essential components of the magnetism detection apparatus according to the present invention.
Figure 2B:
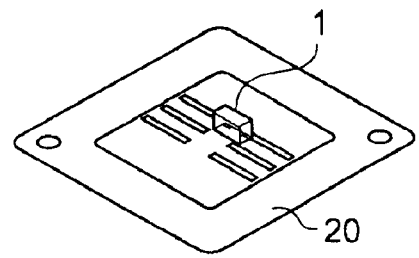
Figure 2C:
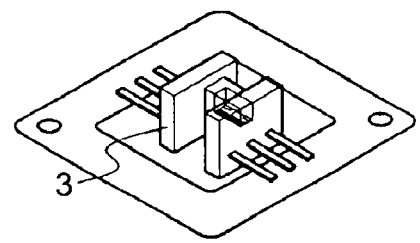
Figure 2D:
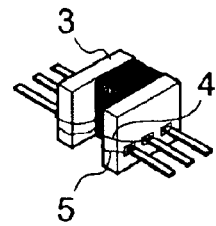
Figure 2E:
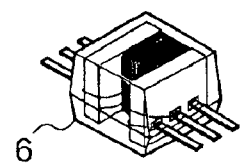
Figure 2F:
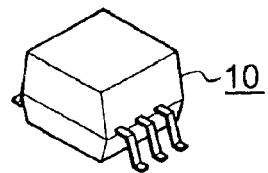

Initially, as illustrated in FIGS. 2(a) and 2(b) the magnetic impedance element 1 is attached between a pair of terminals of a lead frame 20 by any of the uniting methods, including a soldering process, adhesion, and a bonding method. Next, as shown in FIG. 2(c), a resinous bobbin 3 is molded inside the lead frame 20 on which the magnetic impedance element 1 is attached. Next, as shown in FIG. 2(d), after the lead frame 20 is cut off, the biasing coil 4 and the negative-feedback coil 5 are then respectively wound on the resinous bobbin 3. Next, a resinous case 6 is formed on the resinous bobbin 3 wound with the coils 4 and 5 as shown in FIG. 2(e). Finally, the terminals 2 are folded (see FIG. 2(f)), which completes the manufacturing process for the magnetism detection apparatus 10.

It is possible to manufacture a thin-film magnetic impedance element that is 1 mm$^2$ in size, and thus it is possible to reduce the external dimensions of the magnetism detection apparatus 10 to be approximately 5 mm$^3$. This in turn makes it possible to sharply decrease the magnetic resistance between the magnetic impedance element 1 and the coils 4 and 5.

Figure 3:
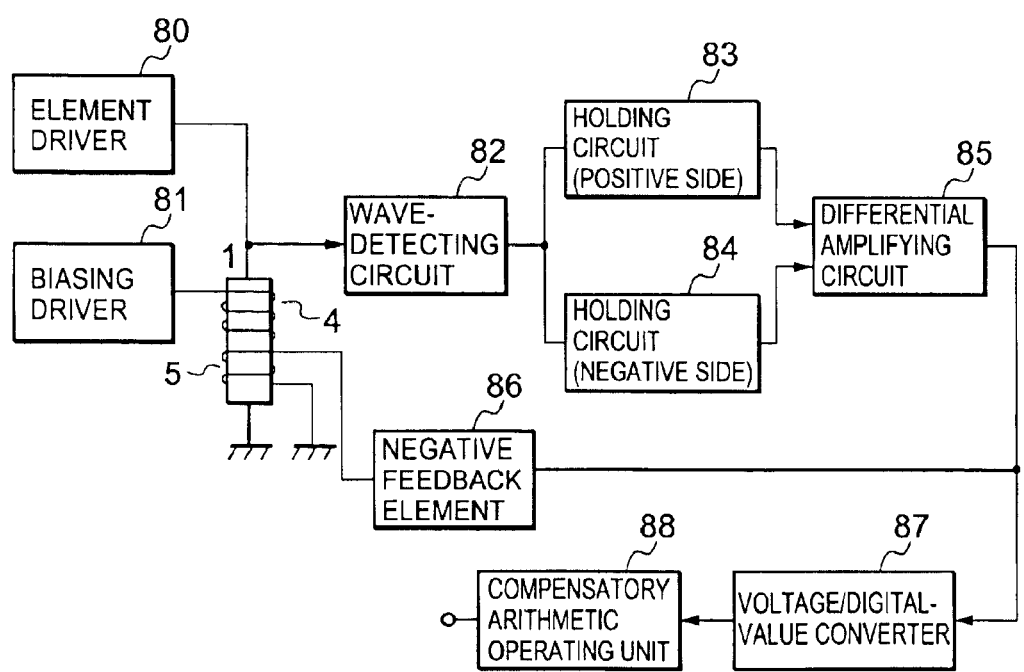
FIG. 3 is a schematic block diagram of a magnetism detection circuit built into the magnetism detection apparatus shown in FIG. 1.

FIG. 3 is a simplified schematic block diagram of the magnetism detection circuit.

In FIG. 3, reference numeral 80 designates an element driver for applying high-frequency current to the magnetic impedance element 1. Reference numeral 81 designates a biasing driver for driving the biasing coil 4. Reference numeral 82 designates a wave-detecting circuit. Reference numerals 83 and 84 respectively designate holding circuits. Reference numeral 85 designates a differential amplifying circuit. Reference numeral 86 designates a feedback element consisting of, for example, a resistor, which is used to feed back an output to the negative-feedback coil 5. The reference numeral 87 designates a voltage/digital-value converter for converting a voltage output from the differential amplifying circuit 85 into a digital value. Reference numeral 88 designates a compensatory arithmetic operating unit consisting of a micro-computer and other devices.

More particularly, initially, the wave-detecting circuit 82 detects variations in impedance caused by an external magnetic field, and then, through synchronization with the timing of a waveform applied to the biasing coil 4, the holding circuit 83 retains the positive side of the detected waveform, while the other holding circuit 84 retains the negative side thereof, thereby enabling the differential amplifying circuit 85 to detect the difference between them.

FIGS. 4(a) to (d) are graphs illustrating the output when AC bias current is applied to the magnetic detection apparatus 10. The graphs show characteristics of a conventional magnetic impedance element. Each graph shows an aspect of the acquisition of sensor output regardless of the direction of the magnetic field, based on a zero magnetic field.

Figure 4A:
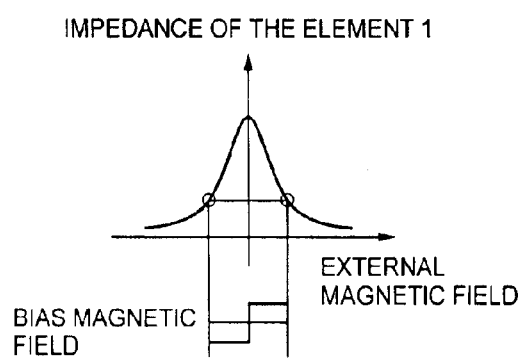
FIGS. 4(a) to (d) are graphs of the AC bias current present in a magnetism detection apparatus.
Figure 4B:
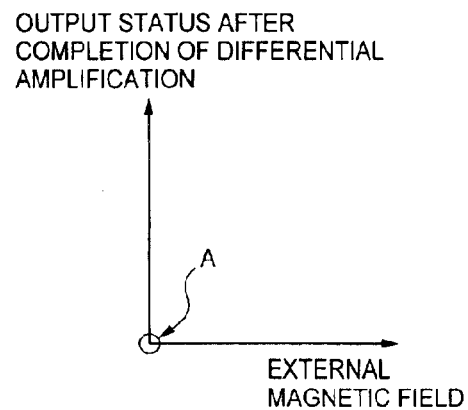

FIGS. 4(a) and 4(b) refer to a case (1) in which the external magnetic field remains in the state of zero, where the output values on the positive and negative sides as detected at the output of the magnetic impedance element 1 are identical to each other, and thus the output values of the holding circuits 83 and 84 are equalized, whereby the output value of the differential amplifying circuit 85 becomes zero, as shown by the arrow A.

Figure 4C:
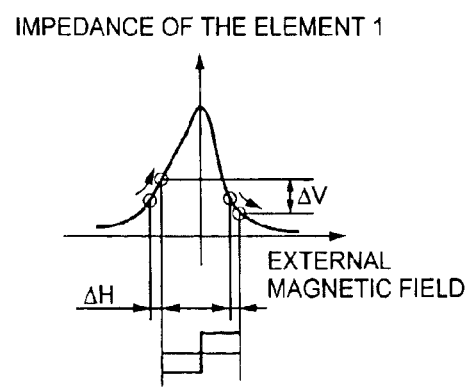
Figure 4D:
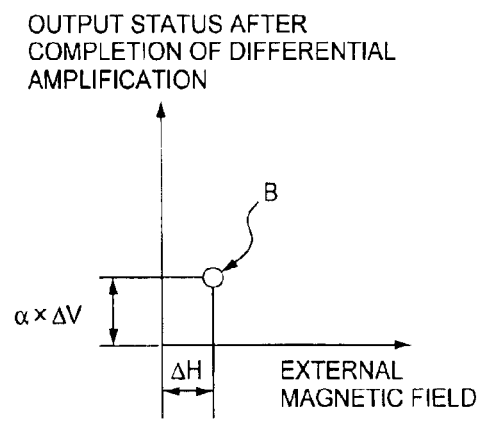

FIGS. 4(c) and 4(d) refer to a case (2) in which an external magnetic field is applied, where the difference between the positive-side output and the negative-side output as detected as the output of the magnetic impedance element 1, becomes $\Delta V$, and thus the difference in the output values between the holding circuits 83 and 84 also becomes $\Delta V$. Accordingly, the output value of the differential amplifying circuit 85 becomes "$\alpha \times \Delta V$" as shown by the arrow B. Note that "$\alpha$" designates the gain of the differential amplifying circuit 85.

As described above, it is possible to automatically compute the output sensitivity of the magnetism detection apparatus by computing the actual output value after applying the known magnetic field to the biasing coil in the state in which the optional magnetic field is applied. Accordingly, with the application of the above-described magnetism detection apparatus, even when the magnetism sensitivity of the magnetic impedance element 1 varies due to environmental characteristics or as a result of quality degradation over time, it is possible to automatically detect the actual sensitivity of the magnetic impedance element 1 and then automatically calibrate the magnetism detection apparatus by the method shown in FIGS. 4(a)–4(d).

Figure 5:
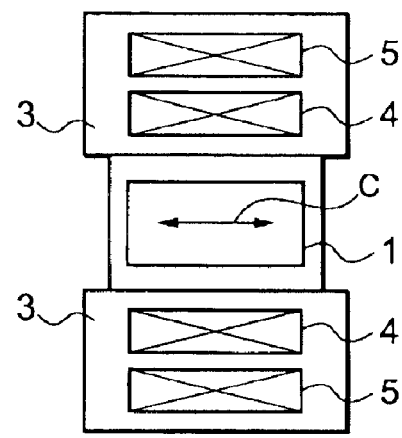
FIG. 5 is a schematic view illustrating the magnetic-field generating direction in a magnetic impedance element.

FIG. 5 is a chart explanatory of the magnetic-field generating direction in the magnetism detection apparatus.

In FIG. 5, the negative-feedback coil 5 is wound on the external or outer side of the biasing coil 4. However, it is also allowable to wind the biasing coil 4 on the external side of the negative-feedback coil 5. By reversing the direction of the magnetic field via the negative-feedback coil 5 against the magnetic-field detecting direction of the magnetic impedance element 1 shown by the arrow C, it is possible to decrease the magnetic field applied to the magnetic impedance element 1, thus making it possible to detect the magnetic field in a broader range.

Figure 6:
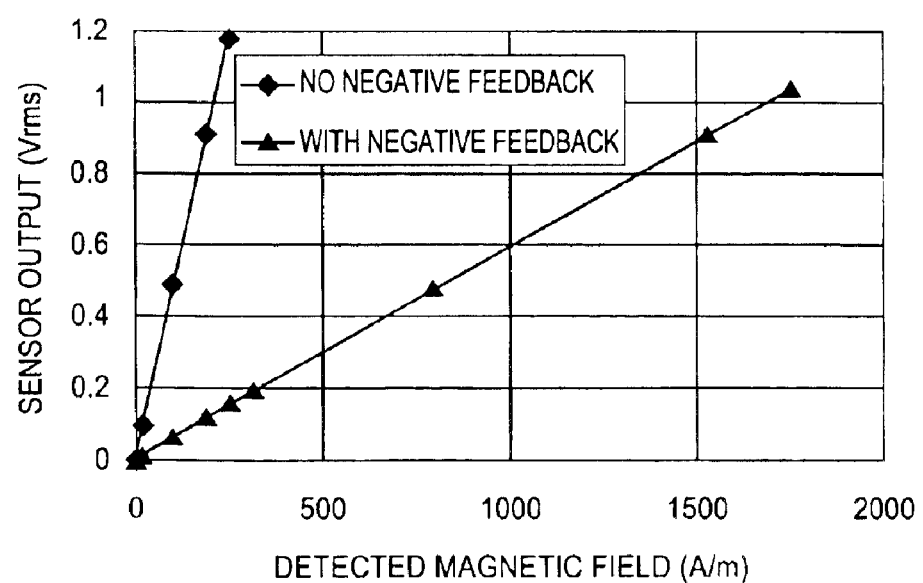
FIG. 6 is a chart showing the characteristics of the magnetism detection apparatus according to the present invention during detection of the magnetic field.

FIG. 6 is a chart exemplifying the output characteristics of the magnetism detection apparatus against the detectable magnetic field when the negative feedback element 86 has optionally been selected. It is found that the magnetic field could be detected in a broader range in the case of providing negative feedback.

Figure 7A:
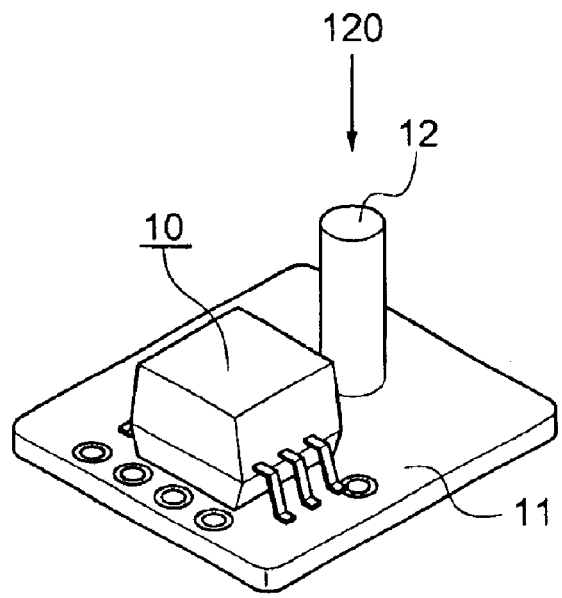
FIGS. 7(a) and (b) illustrate the magnetic-field detecting direction during operation of the magnetism detection apparatus according to the present invention.
Figure 7B:
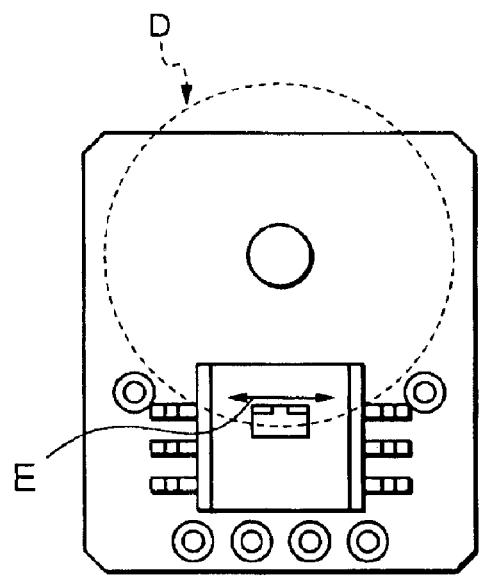

FIGS. 7(a) and 7(b) show an arrangement for detecting current via the magnetism detection apparatus 10, wherein FIG. 7(a) illustrates a perspective view and FIG. 7(b) illustrates a plan view thereof.

In FIG. 7(a), a magnetism detection apparatus has been mounted on a substrate 11 equipped with a current-conductive wire 12. Magnetic flux generated by current 120 is designated by a dotted circle D in FIG. 7(b). By virtue of the disposition of the magnetism detection apparatus 10 with respect to the magnetic flux, the output sensitivity of the magnetism detection apparatus 10 can be determined. Thus, depending on how the magnetism detection apparatus 10 is disposed, it is possible to properly adjust the output sensitivity of the magnetism detection apparatus 10 in correspondence with the magnitude of the current 120. Note that the arrow E on the magnetism detection apparatus 10 in FIG. 7(b) designates the magnetic-field detecting direction of the magnetic impedance element 1.

Figure 8:
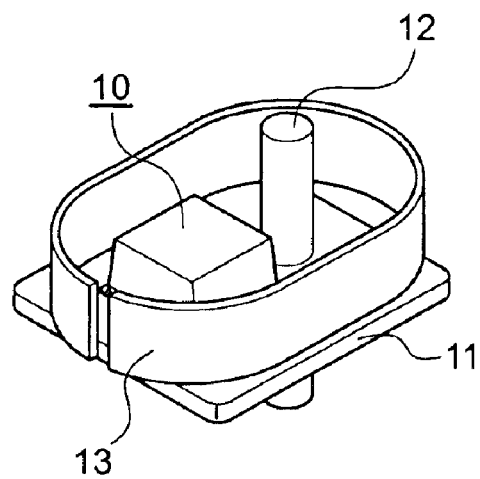
FIG. 8 shows a magnetism shielding mechanism.

FIG. 8 shows the construction of a magnetic shielding structure during the detection of current through the use of the magnetic detection apparatus 10. The magnetic shielding structure 13 is added to the structure shown in FIG. 7. It is important that its configuration be optimized in correspondence with the magnitude of the current 120.

Figure 9:
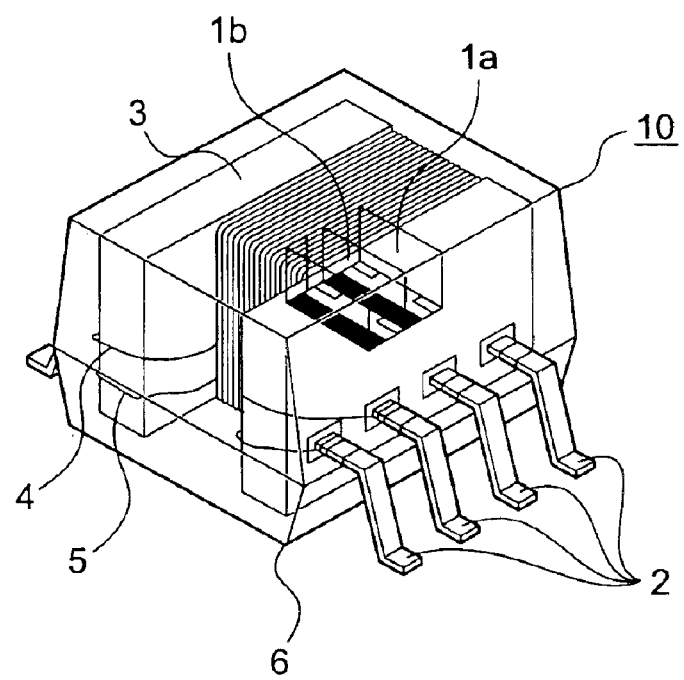
FIG. 9 is a perspective view of the second embodiment of a magnetism detection apparatus according to the present invention.

FIG. 9 is an exploded perspective view of a magnetism detection apparatus according to the second embodiment of the present invention.

The second embodiment is characterized by the provision of two magnetic impedance elements 1a and 1b, in contrast with the one, shown in FIG. 1. As a consequence, it is possible to determine the output difference between the two magnetic impedance elements 1a and 1b, thereby making it possible to detect the actual magnetic field by canceling the adverse effect of the external disruptive magnetic field. As a result, it is possible to conduct detection with higher precision.

Figure 10:
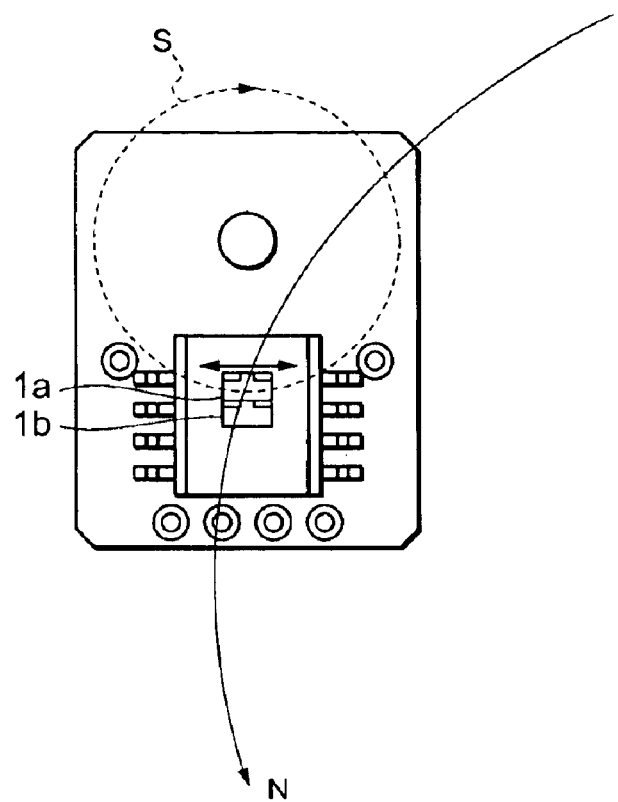
FIG. 10 is a schematic view of a method for canceling an external disruptive magnetic field.

FIG. 10 is a schematic of drawing that will be used to help explain a method for canceling an external disruptive magnetic field.

In FIG. 10, based on the assumption that magnetic fields detectable by the magnetic impedance elements 1a and 1b against a magnetic field S are defined as Sa and Sb, and further, assuming that magnetic fields detectable by the magnetic impedance elements 1a and 1b against a steady external disruptive magnetic field N are defined as N, then the output difference between the magnetic impedance elements 1a and 1b corresponds to the equation (1) shown below.

Differential output=output of 1a−output of 1b=Sa+N−(Sb+N)=Sa−Sb  (1)

Accordingly, it will be understood that magnetic fields can be properly detected without being adversely affected by the steady external disruptive magnetic field N. In FIG. 10, the magnetic flux generated by the external disruptive magnetic field N is indicated by the arrow N.

Figure 11:
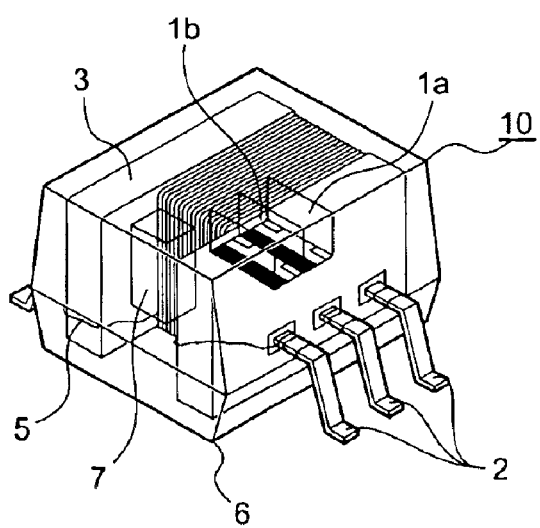
FIG. 11 is a perspective view of the third embodiment of a magnetism detection apparatus according to the present invention.

FIG. 11 is a perspective view of a magnetism detection apparatus according to the third embodiment of the present invention.

The third embodiment is characterized by the provision of a micro-magnet 7 in place of the biasing coil 4 shown in FIG. 9. The micro-magnet 7 applies a DC bias current to the magnetic impedance elements 1a and 1b. This means that no current is drawn by the micro-magnet 7, which is opposite to the case in which a biasing coil is utilized. Normally, a current of approximately 30 mA is required for the biasing coil, and thus, during driving of the micro-magnet 7 with 5 V of power, it is possible to save approximately 150 mW of driving power.

Figure 12A:
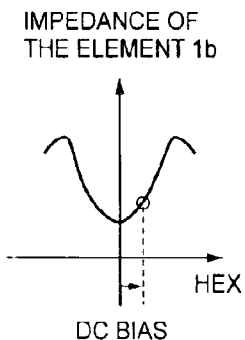
FIGS. 12(a) to (f) show the DC bias current present in the magnetism detection apparatus according to the present invention.
Figure 12B:
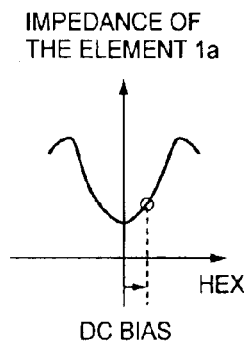
Figure 12C:
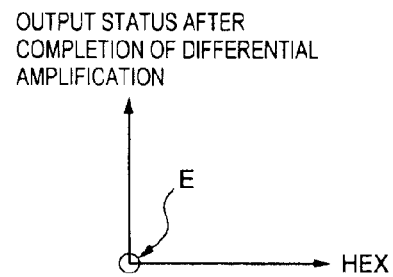

FIGS. 12(a) to (f) show the characteristics of the DC bias current fed by the micro-magnet 7 shown in FIG. 11. The sensor output characteristics against the external magnetic field shown in FIG. 12 exhibit the characteristics of conventional magnetic impedance elements. This in turn illustrates that the optional sensor output can be obtained, based on the zero magnetic field, independently of the direction of the magnetic field. The case (1) formed as shown in FIGS. 12(a), (b), and (c) corresponds to the state in which the external magnetic field is zero, thereby equalizing the output of the magnetic impedance elements 1a and 1b, enabling the output of the holding circuits 83 and 84 to be equalized. In consequence, the output value of the differential amplifying circuit 85 becomes zero, as shown by the arrow E.

Figure 12D:
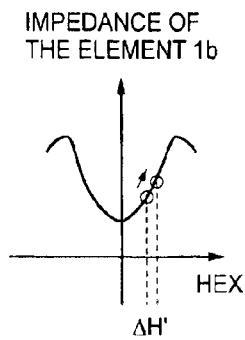
Figure 12E:
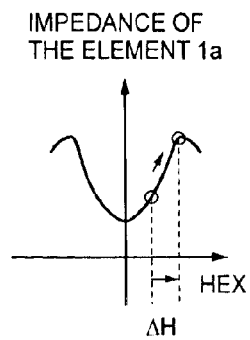
Figure 12F:
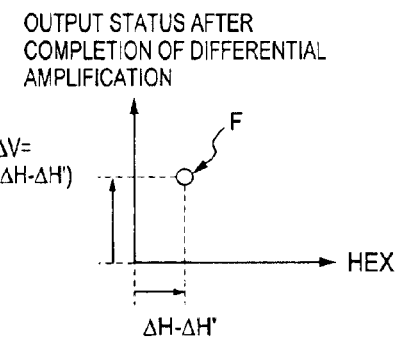

In the case (2) formed as shown in FIGS. 12(d), (e), and (f), the output difference between the magnetic impedance elements 1a and 1b becomes $\Delta V$ in the state in which the external magnetic field $\Delta H$ is applied. Accordingly, the output difference between the holding circuits 83 and 84 also becomes $\Delta V$, and thus, as shown by the arrow F, the output value of the differential amplifying circuit 85 corresponds to the expression shown below.

$$A \times \Delta V (= \alpha \times (\Delta H - \Delta H'))$$

Note that A designates the gain of the differential amplifying circuit 85.

Figure 13:
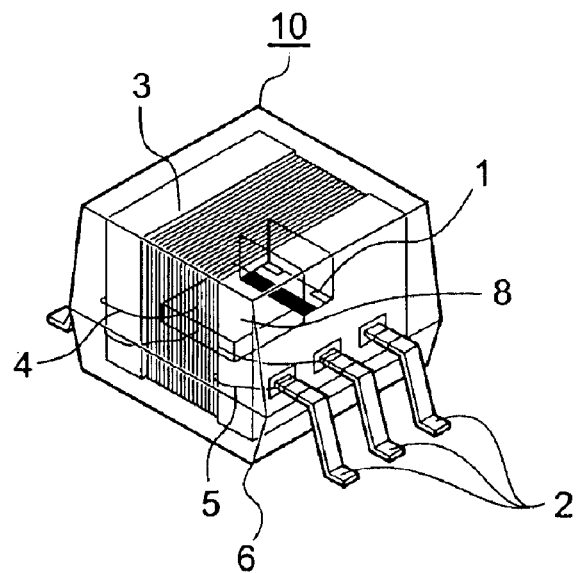
FIG. 13 is a perspective view of the fourth embodiment of a magnetism detection apparatus according to the present invention.
Figure 14:
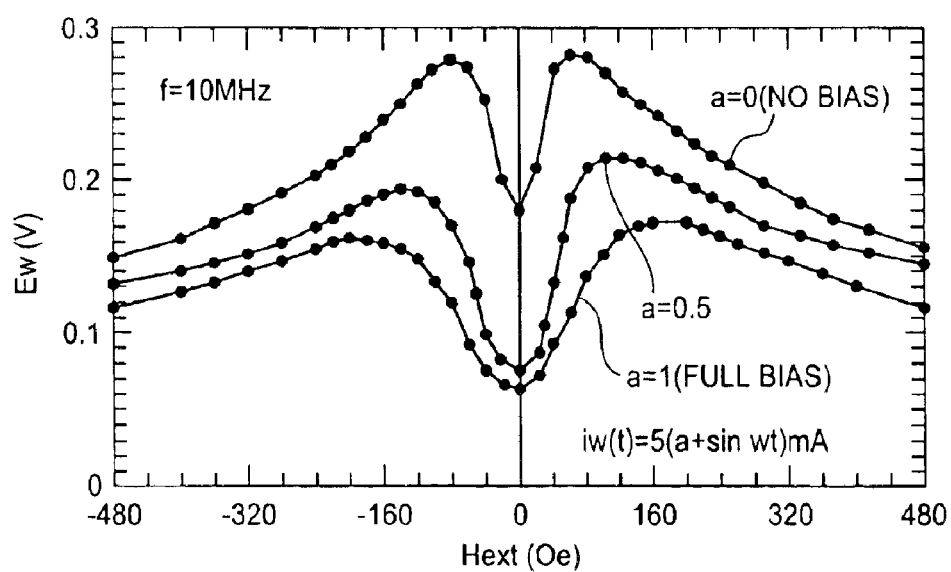
FIG. 14 is a chart for explaining the magnetic impedance characteristics of amorphous wires.
Figure 15:
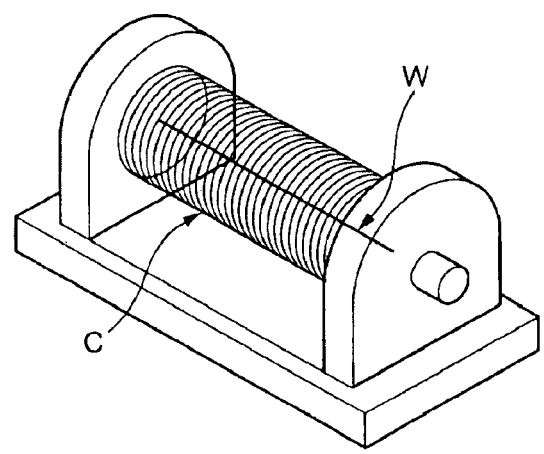
FIG. 15 is a perspective view showing a simplified configuration of a magnetism detection apparatus using amorphous wires.
Figure 16:
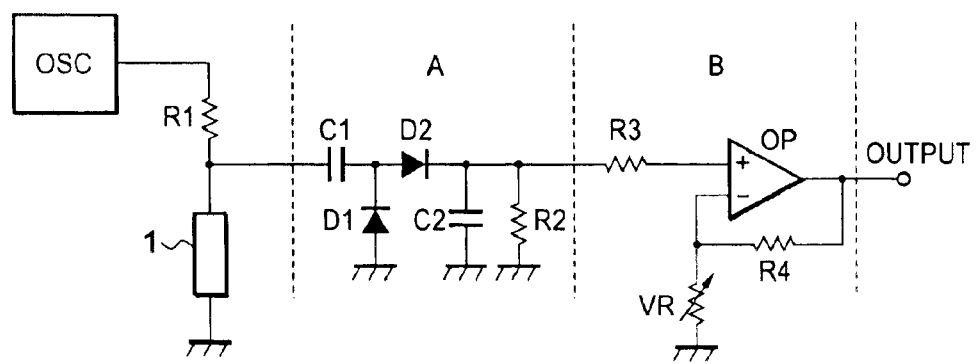
FIG. 16 shows the circuitry of a conventional magnetism detection circuit.

FIG. 13 is a perspective view of a magnetism detection apparatus according to the fourth embodiment of the present invention.

The fourth embodiment is characterized by the provision of the magnetism detection circuit 8 inside the magnetism detection apparatus, as shown in FIG. 3, in contrast with the constitution of the magnetism detection apparatus shown in FIG. 1. By virtue of this arrangement, it is possible to enhance the signal-to-noise (S/N) ratio of the sensor signals. Further, by internally storing a variety of corrective data obtained by the automatic calibration described earlier with reference to FIG. 4 for each magnetic impedance element 1, the magnetism detecting operation can be executed with much higher precision. As a matter of course, the magnetism detection circuit 8 is also applicable to the magnetism detection apparatuses shown in FIGS. 9 and 11.

According to the present invention, as a result of the integral assembly of the magnetic impedance elements, biasing coils, negative-feedback coils, and terminals through a resinous molding process, it has become possible to minimize magnetic resistance, thereby further minimizing the amount of bias current and negative-feedback current. Accordingly, it is possible for the present invention to provide a downsized and low-power-consumption magnetism detection apparatus.

Further, as it is possible to apply a known magnetic field via a biasing coil, by automatically detecting the actual sensitivity of the magnetic impedance element via the output, it is possible for the present invention to provide a high-precision magnetism detection apparatus distinguished in terms of its durability against environmental conditions.

Further, as it is possible to cause the negative-feedback current to decrease the detectable magnetic field, by increasing the negative-feedback current, it is possible to adjust the output sensitivity of the magnetism detection apparatus against a detected magnetic field. Accordingly, it is possible to provide a low-power-consumption magnetism detection apparatus capable of detecting magnetism in a wide range without causing the detected magnetic field to saturate the output potentials of the magnetism detection apparatus.

Further, by detecting the output difference between two magnetic impedance elements, it is possible to cancel the adverse effects of an external disruptive magnetic field, thereby enabling the present invention to provide a low-power-consumption and high-precision magnetism detection apparatus.

Further, by causing a micro-magnet to apply a bias magnetic field of the magnetic impedance element, the amount of current to be applied to the biasing coil is further decreased, thereby facilitating a further reduction in power consumption.

Further, by internally providing a signal-processing circuit (i.e., a magnetism detection circuit), it is possible to enhance the signal-to-noise (S/N) ratio of the sensor signal. In particular, by application of a variety of internally stored correction data, it is possible to provide an improved magnetism detection apparatus featuring excellent durability against environmental hazards, high precision, and low power consumption.

Further, as a result of the formation of a thin-film-type magnetic impedance element, there is little variation of output caused by the magnetostrictive effect, which normally causes problems in wire-type magnetic impedance elements. As a result, it is possible for the present invention to provide a high-precision and low-power-consumption magnetism detection apparatus.

What is claimed is:

1. A magnetism detection apparatus, comprising;
   a magnetic impedance element providing a magnetic impedance effect, said magnetic impedance element having a pair of ends;
   terminals for applying AC current to both ends of said magnetic impedance element;
   a first coil;
   a second coil;
   further terminals connected to said first and second coils for applying a bias magnetic field using said first coil and a negative-feedback magnetic field to said magnetic impedance element using said second coil:
   a body in which said magnetic impedance element and said first and second coils are integrally combined through a resinous molding process, with said terminals and further terminals protruding from said body.

2. A magnetism detection apparatus, comprising;
   a pair of magnetic impedance elements each providing a magnetic impedance effect, each of said magnetic impedance elements having a pair of ends;
   terminals for applying AC current to both ends of each of said magnetic impedance elements;
   a plurality of first coils;
   a second coil for conformity with the first coil;
   further terminals connected to said first and second coils for applying a bias magnetic field to each of said magnetic impedance elements using said first coils and for applying a negative feedback magnetic field to each of said magnetic impedance elements using said second coil; and
   a body in which said magnetic impedance elements and said first and second coils are integrally combined through a resinous molding process, with said terminals and further terminals protruding from said body.

3. A magnetism detection apparatus according to claim 2, wherein said second coil is a single coil capable of providing a pair of said magnetic impedance elements with magnetic fields in the same direction.

4. A magnetism detection apparatus, comprising;

at least two magnetic impedance elements each providing a magnetic impedance effect, each of said magnetic impedance elements having a pair of ends;

terminals for applying AC current to both ends of each of said magnetic impedance elements;

a magnet for applying bias magnetic field to each of said magnetic impedance elements;

a coil;

further terminals connected to said coil for applying a negative-feedback magnetic field to each of said magnetic impedance elements; and a body in which said magnetic impedance elements, said magnet, and said coil are integrally combined through a resinous molding process, with said terminals and further terminals protruding through said body.

5. A magnetism detection apparatus according to claim 1, further comprising a circuit that outputs a signal to said second coil, in proportion to an output from said magnetic impedance element, said circuit being disposed within said body along with said magnetic impedance element and said first and second coils.

6. A magnetism detection apparatus according to claim 1, wherein said magnetic impedance element is a thin-film magnetic impedance element.

7. A magnetic detection apparatus according to claim 2, further comprising a circuit that outputs a signal to said second coil, in proportion to an output from said magnetic detection elements.

8. A magnetic detection apparatus according to claim 3, further comprising a circuit that outputs a signal to said second coil, in proportion to an output from said magnetic detection elements.

9. A magnetic detection apparatus according to claim 4, further comprising a circuit that outputs a signal to said coil, in proportion to an output from said magnetic detection element.

10. A magnetic detection apparatus according to claim 2, wherein said magnetic impedance elements are thin film magnetic impedance elements.

11. A magnetic detection apparatus according to claim 3, wherein said magnetic impedance elements are thin film magnetic impedance elements.

12. A magnetic detection apparatus according to claim 4, wherein said magnetic impedance elements are thin film magnetic impedance elements.

13. A magnetic detection apparatus according to claim 2, further comprising a circuit that outputs a signal to said second coil, in proportion to an output from at least one of said magnetic impedance elements, said circuit being disposed within said body along with said magnetic impedance elements, said first coils, and said second coil.

14. A magnetic detection apparatus according to claim 3, further comprising a circuit that outputs a signal to said second coil, in proportion to an output from at least one of said magnetic impedance elements, said circuit being disposed within said body along with said magnetic impedance elements, said first coils, and said second coil.

15. A magnetic detection apparatus according to claim 4, further comprising a circuit that outputs a signal to said coil, in proportion to an output from at least one of said magnetic impedance elements, said circuit being disposed within said body along with said magnetic impedance elements, said magnet, and said coil.

16. A magnetic detection apparatus according to claim 1, further comprising a circuit that outputs a signal to said second coil, in proportion to an output from said magnetic impedance element, said circuit including an element driver that supplies a high frequency current to said magnetic impedance element, a biasing driver that supplies a bias signal to said first coil, first means connected to said element driver for generating a feedback signal for said second coil, and second means connected to said first means, for generating a magnetic detection output signal.

17. A magnetic detection apparatus according to claim 16, wherein said first means comprises a wave-detecting circuit that is connected to said element driver, a positive side holding circuit and a negative side holding circuit that are connected to said wave-detecting circuit, a differential amplifier circuit that is connected to said positive side and negative side holding circuits, and a negative feedback element that is connected between said differential amplifier circuit and said second coil.

18. A magnetic detection apparatus according to claim 17, wherein said second means comprises a voltage/digital-value converter that receives an output signal from said differential amplifier circuit, and compensatory arithmetic operating unit means for generating said magnetic detection output signal from digital values generated by said voltage/digital-value converter.

* * * * *